United States Patent [19]
Eitan et al.

[11] Patent Number: 6,128,226
[45] Date of Patent: Oct. 3, 2000

[54] METHOD AND APPARATUS FOR OPERATING WITH A CLOSE TO GROUND SIGNAL

[75] Inventors: Boaz Eitan, Ra'anana; Oleg Dadashev, Hadera, both of Israel

[73] Assignees: Saifun Semiconductors Ltd., Netanya; Tower Semiconductors Ltd., Migdal Haemek, both of Israel

[21] Appl. No.: 09/244,439

[22] Filed: Feb. 4, 1999

[51] Int. Cl.[7] .................................................. G11C 16/06
[52] U.S. Cl. .............................. 365/185.21; 365/185.2; 365/185.25; 365/189.07
[58] Field of Search ........................ 365/185.21, 185.2, 365/185.25, 207, 233, 189.07

[56] References Cited

U.S. PATENT DOCUMENTS

| | | | |
|---|---|---|---|
| 4,916,671 | 4/1990 | Ichiguchi | 365/233 |
| 5,812,456 | 9/1998 | Hull et al. | 365/185.21 X |
| 5,936,888 | 8/1999 | Sugawara | 365/185.2 |

*Primary Examiner*—Huan Hoang
*Attorney, Agent, or Firm*—Skjerven, Morrill, MacPherson, Franklin & Friel LLP; Alan H. MacPherson; Hugh H. Matsubayashi

[57] ABSTRACT

A method for sensing a close to ground signal recieved from an array cell within a memory array includes the steps of providing a reference unit with a reference cell having a similar structure and a similar current path therethrough to that of the array cell, providing a timing unit with a timing cell having a similar structure and a similar current path therethrough to that of the array cell, discharging the array, the reference unit and the timing unit prior to charging them, generating a cell signal, a reference signal and a timing signal, respectively, upon charging, generating a read signal when the timing signal at least reaches a predefined voltage level and generating a sensing signal from the difference of the cell and reference signals once the read signal is generated. The reference unit has a reference capacitance which is a multiple of the expected capacitance of a bit line of the array and the timing unit has a predefined timing capacitance.

9 Claims, 5 Drawing Sheets

METHOD AND APPARATUS FOR OPERATING WITH A CLOSE TO GROUND SIGNAL

CROSS-REFERENCE TO RELATED APPLICATION

This application is related to an application entitled "Method and Device for Determining the Validity of Wordline Conditions", filed on the same day herewith.

FIELD OF THE INVENTION

The present invention relates to devices for operating with close to ground signals, in general, and to de vices for sensing such a signal which is received from a memory cell, in particular.

BACKGROUND OF THE INVENTION

Memory devices, such as random access memory (RAM), read-only memory (ROM), non-volatile memory (NVM) and like, are known in the art.

These devices provide an indication of the data which is stored therein by providing an output electrical signal. A device called a sense amplifier is used for detecting the signal and determining the logical content thereof. U.S. Pat. No. 4,916,671 to Ichiguchi describes one such sense amplifier.

In general, prior art sense amplifiers determine the logical value stored in a cell by comparing the output of the cell with a threshold voltage level. If the output is above the threshold, the cell is determined to be erased (with a logical value of 1) and if the output is below the threshold, the cell is determined to be programmed (with a logical value of 0).

The threshold level is typically set as a voltage level between the expected erased and programmed voltage levels which is high enough (or sufficiently far from both expected voltage levels) so that noise on the output will not cause false results. Typically, the expected erased and programmed voltage levels are 2.5V and 1.5V, respectively, and the threshold level is 2V.

Unfortunately, a high threshold level requires that the cell being sensed be given a sufficient amount of time to fully develop its signal thereby ensuring that, for an erased cell, the resultant signal has reached its full (high) voltage level. In order to achieve this in a reasonable amount of time, the entire array is first brought (or "equalized") to a medium voltage level which the cell being sensed either increases (if it is erased) or decreases (if it is programmed). The equalization operation is time-consuming and requires a considerable amount of power.

SUMMARY OF THE PRESENT INVENTION

It is an object of the present invention to provide a method and apparatus for operating with a close to ground signal.

There is therefore provided, in accordance with a preferred embodiment of the present invention, a method for sensing a close to ground signal received from an array cell within a memory array. The method includes the steps of providing a reference unit with a reference cell having a similar structure and a similar current path therethrough to that of the array cell, providing a timing unit with a timing cell having a similar structure and a similar current path therethrough to that of the array cell, discharging the array, the reference unit and the timing unit prior to charging them, generating a cell signal, a reference signal and a timing signal, respectively, upon charging, generating a read signal when the timing signal at least reaches a predefined voltage level and generating a sensing signal from the difference of the cell and reference signals once the read signal is generated. The reference unit has a reference capacitance which is a multiple of the expected capacitance of a bit line of the array and the timing unit has a predefined timing capacitance.

Additionally, in accordance with a preferred embodiment of the present invention, the method includes the steps of providing the reference capacitance with a multiplicity of bit lines each having the same structure as the array bit line and the timing capacitance with a capacitor.

Moreover, in accordance with a preferred embodiment of the present invention, the step of generating a sensing signal includes the steps of amplifying the reference and cell signals, generating a difference signal representing the difference between the amplified reference and cell signals and converting the difference signal to a logical signal.

There is also provided, in accordance with a preferred embodiment of the present invention, a unit for sensing a close to ground, cell signal received from an array cell within a memory array. The unit includes a reference unit, a timing unit and a differential comparator. The reference unit has a structure which emulates the response of an erased array cell when charged and a reference capacitance which is a multiple of the expected capacitance of a bit line of the array and produces a close to ground reference signal when the array cell is charged. The timing unit has a structure which emulates the response of an erased array cell when charged and a predefined reference capacitance and produces a close to ground timing signal when the array cell is charged. The differential comparator generates a sensing signal from the difference of the cell and reference signals once the read signal is generated.

Further, in accordance with a preferred embodiment of the present invention, the reference unit includes a non-programmed reference cell, a multiplexor, a multiplicity of bit lines and a discharge unit. The reference cell has a similar structure to that of the array cell. The multiplexor has a similar current path therethrough to that of the array cell. The bit lines provide the reference capacitance, wherein each has the same structure as the array bit line. The discharge unit discharges and charges the reference unit along with the array and generates the reference signal during charging of the reference unit.

Still further, in accordance with a preferred embodiment of the present invention, the timing unit includes a non-programmed timing cell, a multiplexor, a capacitor, a discharge unit and a timing comparator. The timing cell has a similar structure to that of the array cell. The multiplexor has a similar current path therethrough to that of the array cell. The capacitor provides the timing capacitance. The discharge unit discharges and charges the timing unit along with the array and for generating the timing signal during charging of the timing unit. The timing comparator generates a read signal when the timing signal at least reaches a predefined voltage level.

Additionally, in accordance with a preferred embodiment of the present invention, the differential comparator includes first and second differential amplifiers and a driver. The first differential amplifier receives the cell signal and the reference signal produces two output signals. The second differential amplifier receives the two output signals and produces the data signal. The driver is controlled by the control signal and provides the data signal to an external unit.

Finally, in accordance with a preferred embodiment of the present invention, the timing comparator includes first and second differential amplifiers, and a driver. The first differential amplifier receives the timing signal and the supply signal and produces two output signals. The second differential amplifier receives the two output signals and produces the control signal. The driver provides the control signal to the comparator.

BRIEF DESCRIPTION OF THE DRAWINGS

The present invention will be understood and appreciated more fully from the following detailed description taken in conjunction with the drawings in which.

DETAILED DESCRIPTION OF A PREFERRED EMBODIMENT

The present invention is a method and apparatus which senses a voltage which has risen from ground while the voltage level is still close to the ground level. Since sensing occurs from the ground level, the present invention is useful for memory arrays which are pre-charged to ground. Such a memory array is described in the patent application no. 09/246,776 entitled "Method for Initiating a Retrieval Procedure in Virtual Ground Arrays" to Eitan, which is filed on the same day herewith and is hereby incorporated by reference.

In the invention of Eitan, after pre-charging to ground, the source line of a cell to be read is pre-charged to a predetermined voltage level. When the sensing line is disconnected from the ground potential, the cell exhibits a voltage rise. In accordance with a preferred embodiment of the present invention, the content of the cell is determined from its drain line even though the voltage thereon is small.

Prior art sense amplifiers, which have a fixed threshold against which the data of a cell is compared, cannot be used to sense the low voltage output of a cell because, at low voltages, the output is subject to considerable noise. The noise typically comes from variations in the power supply level Vdd and in the reaction of the cell to be read to changes in temperature. The present invention provides a method and apparatus for sensing such low voltage output, irrespective of the temperature or of the power supply level.

Figure 1:
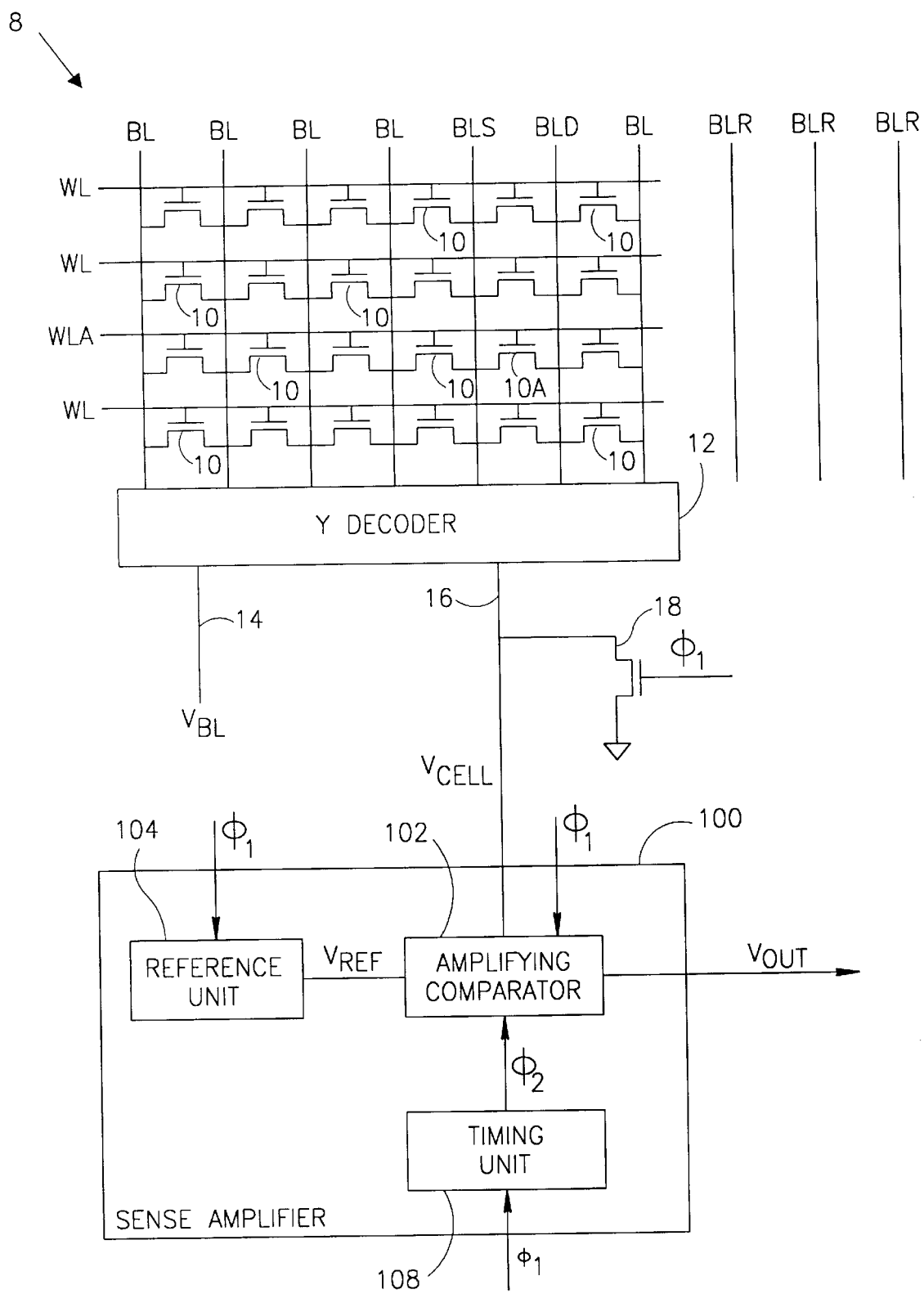
FIG. 1 is a schematic illustration of a memory cell and a sense amplifier, constructed and operative in accordance with a preferred embodiment of the present invention.

Reference is now made to FIG. 1, which is a schematic illustration of a memory array 8 and a sense amplifier, generally referenced 100, constructed and operative in accordance with a preferred embodiment of the present invention. Reference is also made to FIGS. 2A, 2B, 2C and 2D which illustrate the various aspects of timing associated with the present invention.

The memory array has a multiplicity of cells 10, organized into rows and columns. The gates of a single row of cells are connected to a word line WL, the sources of a column of cells are connected to a bit line BL, as are the drains of the column. It is noted that the term "bit line" is used herein to mean a metal bit line along which current is carried.

FIG. 1 shows a cell 10A to be read which is connected between two bit lines, labeled BLS and BLD, with its gate connected to a word line WLA. FIG. 1 also shows additional, reference bit lines BLR located near the other bit lines BL of the array. These reference bit lines BLR, described in more detail hereinbelow, have the same length and structure as the other bit lines BL of the array and, therefore, are located near the array. Furthermore, bit lines BLR are pre-charged and discharged along with the other bit lines BL of the array.

It is noted that, in the embodiment described herein, the architecture of the array is symmetric such that, no matter where in the array the cell to be sensed is located, the length of the current path to it is constant. Such an architecture is described in U.S. patent application 08/989,690 to Eitan, now U.S. Pat. No. 5,963,465 issued on Oct. 5, 1999, which is incorporated herein by reference. It will be appreciated that the present invention can also be implemented in non-symmetric arrays.

All the bit lines BL are connected to a Y decoder 12. During sensing, Y decoder 12 connects bit line BLS to a supply line 14 having a source voltage $V_{BL}$ thereon and bit line BLD to a sensing line 16. When a voltage $V_{BL}$ is applied to supply line 14, cell 10A responds and the voltage on sensing line 16 will change accordingly, to be measured by sense amplifier 100.

Sense amplifier 100 comprises an amplifying comparator 102, a reference unit 104 and a timing unit 108. Amplifying comparator 102 receives a voltage on sensing line 16, labeled $V_{CELL}$, a voltage $V_{REF}$ from reference unit 104 and a signal $\Phi_2$ from timing unit 108, and produces a sense data output signal therefrom.

In accordance with a preferred embodiment of the present invention and as will be described in more detail hereinbelow, reference unit 104 and timing unit 108 each include sensing emulators which emulate the elements found in the path from supply line 14, through cell 10A to be read, to sensing line 16, so that sense amplifier 100 will have approximately the same response to temperature as cell 10A being read. Thus, temperature will not seriously affect the ability of sense amplifier 100 to sense the data of cell 10A.

Furthermore, as will be described hereinbelow, amplifying comparator 102 is formed of differential amplifiers and thus, any variation in supply Vdd which affects the input signals $V_{CELL}$ and $V_{REF}$ to amplifying comparator 102 will be canceled out.

Connected to sensing line 16 is an N-channel Metal Oxide Semiconductor (NMOS) switching transistor 18 which is controlled by a control signal $\Phi_1$. Switching transistor 18 switchably connects sensing line 16 with either sense amplifier 100 or with a ground supply (not shown). When $\Phi_1$ is high, switching transistor 18 is active, allowing connection between sensing line 16 and the ground supply, and thereby discharging cell 10A. However, when $\Phi_1$ is low, switching transistor 18 is inactive, which permits data flow between sensing line 16 and sense amplifier 100.

Signal $\Phi_1$ is also provided to amplifying comparator 102, reference unit 104 and timing unit 108 where it functions similarly, forcing the signals of interest to develop from the ground voltage, as will be described in more detail hereinbelow.

Figure 2A:
FIG. 2A is an illustration of a timing scheme of the entire sensing procedure.

The timing scheme of signal $\Phi_1$ is shown in FIG. 2A. Signal $\Phi_1$ has a section 302 which denotes the time period during which, in accordance with a preferred embodiment of the present invention, the cells of the array are pre-charged to ground. After pre-charging, signal $\Phi_1$ changes state and remains in the changed state for a period, denoted 304, long enough for the cell signal $V_{CELL}$ to be developed. At the end of period 304, signal $\Phi_1$ changes state again, after which, sense amplifier 100 provides a valid data output, indicative of the content of the cell 10A.

Figure 2B:
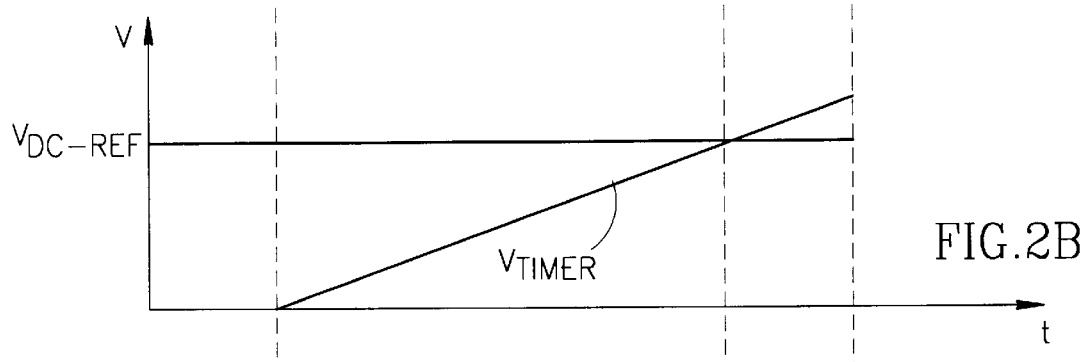
FIG. 2B is an illustration of a timing scheme of the amplification stage.

FIG. 2B illustrates the operation of timing unit 108. During period 304 of signal $\Phi_1$ (FIG. 2A), a signal $V_{TIMER}$ begins developing from ground. When signal $V_{TIMER}$ reaches or exceeds the voltage level $V_{DC-REF}$ (typically at a low voltage level, such as 100–200 mV), timing unit 102 makes a change in the signal $\Phi_2$, shown in FIG. 2C. Signal $\Phi_2$ is active for an output period 308 during which amplifying comparator 102 produces a signal representative of the data in cell 10A.

Figure 2C:
FIG. 2C is an illustration of the voltage profiles which are used for operating the timing unit of FIG. 1, according to a preferred embodiment of the present invention.
Figure 2D:
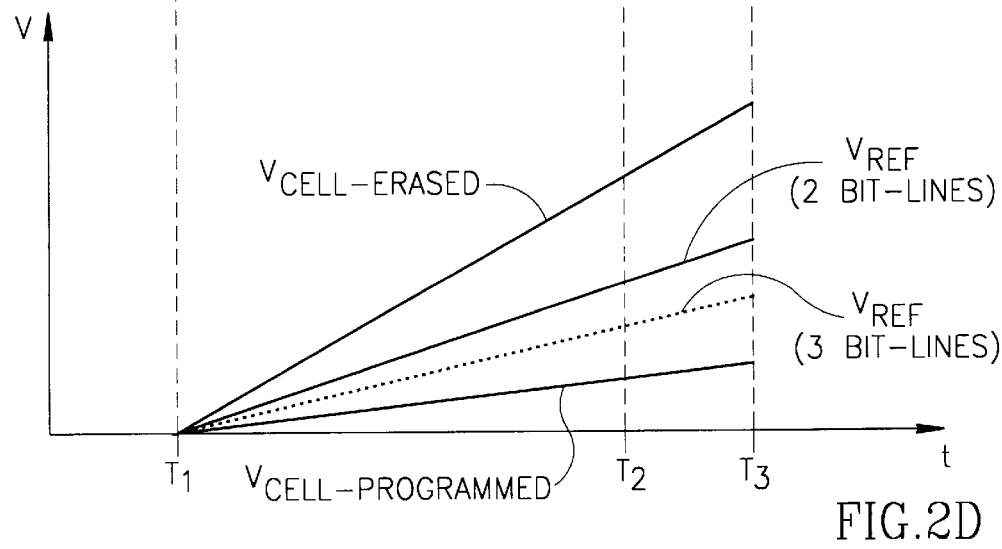
FIG. 2D is an illustration of the voltage profiles, which are present in the detection procedure.

FIG. 2D shows the operation of amplifying comparator 102. At time T1, which occurs at the beginning of period 304 (FIG. 2A), reference unit 104 begins growing the signal $V_{REF}$ from ground. At the same time, the cell 10A, which was pre-charged to ground, begins charging with the voltage $V_{BL}$ on the supply line 14. At time T2, a sensing period between times T1 and T2 ends and an output period 308 (FIG. 2C) begins, during which amplifying comparator 102 compares the voltage level $V_{CELL}$ on sensing line 16 with the voltage level $V_{REF}$ produced by reference unit 104. This comparison continues until the end, labeled T3, of output period 308.

A programmed cell exhibits high electrical resistance and as such, provides low current and hence a slow voltage rise. An erased cell exhibits low electrical resistance and, a s such, provides high current and hence a fast voltage rise The signal $V_{CELL-PROGRAMMED}$ of FIG. 2D illustrates the voltage profile which characterizes a programmed cell when operating in its linear range. The signal $V_{CELL-ERASED}$ of FIG. 2D illustrates the voltage profile which characterizes an erased cell, also in its linear operating range. As can be seen in FIG. 2D, the reference signal $V_{REF}$ has a voltage profile between $V_{CELL-ERASED}$ and $V_{CELL-PROGRAMMED}$ and thus, differentiates between the two. FIG. 2D shows two types of reference signals $V_{REF}$, as will be described in more detail hereinbelow.

It will be appreciated that the signals $V_{CELL}$, $V_{REF}$ and $V_{TIMER}$ will vary with temperature, as described in more detail hereinbelow. However, since they all depend on temperature in the same way, they will vary together, maintaining the relationships of which signal is higher and lower that are shown in FIG. 2D. Accordingly, the voltage level of cell 10A to be read can be sensed at fairly low voltages, such as 200–300 mV.

It will further be appreciated that the signals $V_{CELL}$, $V_{REF}$ and $V_{TIMER}$ all begin at the same, ground voltage. This ensures that the signals begin developing at the same time and ensures that the signals relatively quickly arrive at the low voltages at which the data is to be read. Both of these aspects enables the time to sensing to be short, since no time is wasted waiting for the signals to arrive at their initial voltage levels and the rise time from ground is short.

Figure 3:
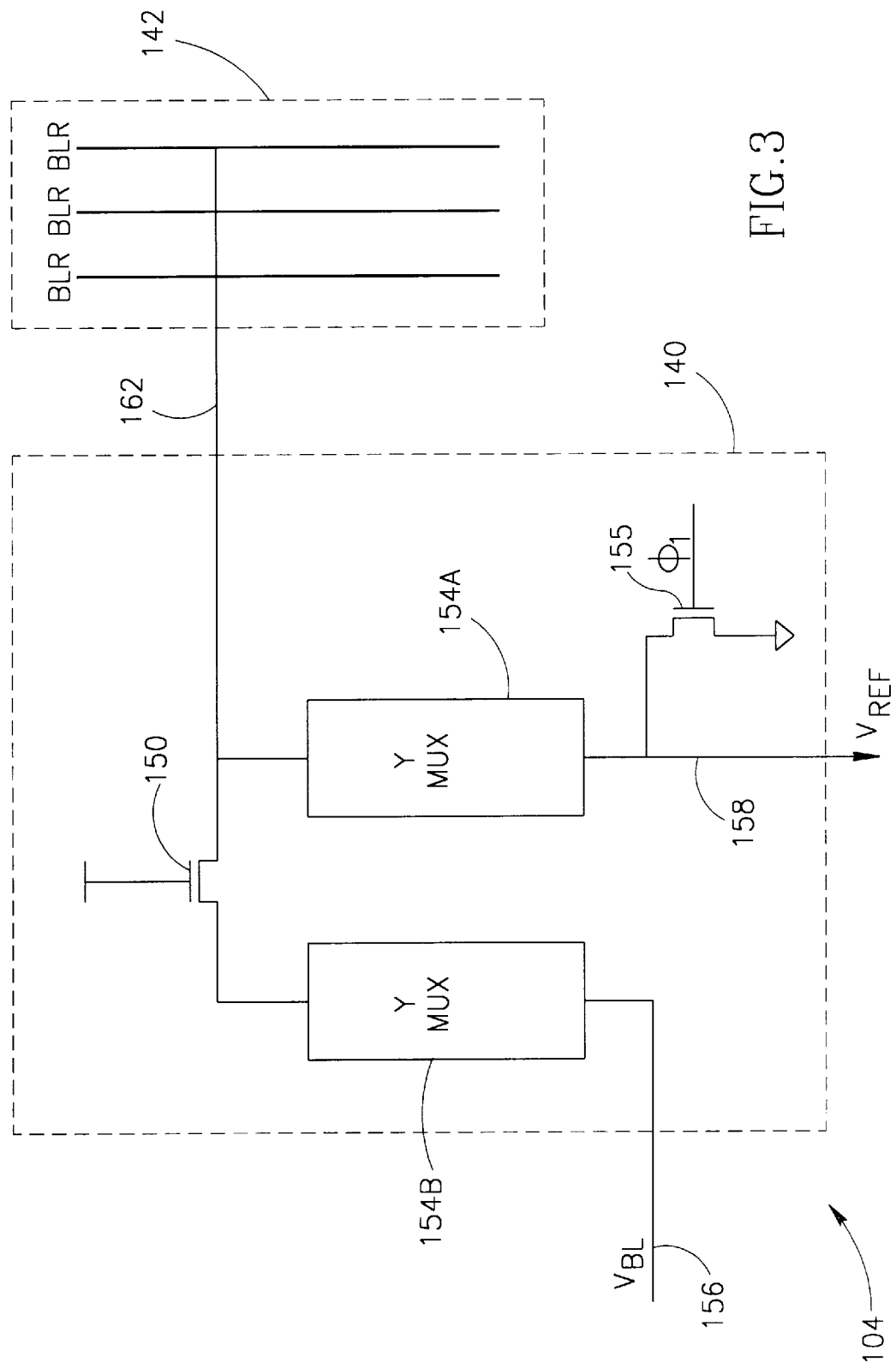
FIG. 3 is a schematic illustration of a reference unit of the sense amplifier of FIG. 1, constructed and operative in accordance with a preferred embodiment of the present invention.

Reference is now made to FIG. 3, which is a schematic illustration of the reference unit 104, constructed and operative in accordance with a preferred embodiment of the present invention.

Reference unit 104 includes a sensing emulator 140 and a bit line emulator 142, formed of reference bit lines BLR. Sensing emulator 140 emulates the conditions and environmental behavior of the elements used to sense the data in cell 10A. The bit line emulator 142 emulates the capacitance of the bit lines BLS and BLD which pass current through cell 10A. This capacitance affects the time it takes for the cell signal $V_{CELL}$ to develop to a desired level. Similarly, the capacitance of bit lines BLR affects the time it takes for the reference signal $V_{REF}$ to develop to a desired level. The number of bit lines BLR used depends on the relationship desired for the two signals $V_{CELL}$ and $V_{REF}$, as described hereinbelow.

Sensing emulator 140 includes a reference cell 150, a multiplexor which includes a source section 154B and a drain section 154A, and an NMOS switching transistor 155. Reference cell 150 emulates cell 10A to be sensed. Source section 154B, which connects between a supply line 156 carrying supply $V_{BL}$ and reference cell 150, emulates the expected path from supply line 14 through Y decoder 12 to cell 10A. Typically this path has a few transistors therein. Similarly, drain section 154A, which connects between reference cell 150 and an output line 158, emulates the expected path from cell 10A through Y decoder 12 to sensing line 16 and does so with a few transistors.

Switching transistor 155, which emulates switching transistor 18 and is controlled by $\Phi_1$, controls when reference cell 150 is grounded and when reference unit 104 allows reference signal $V_{REF}$ to develop. As for switching transistor 18, when $\Phi_1$ is high, switching transistor 155 grounds reference cell 150. When $\Phi_1$ is low, switching transistor 155 has no affect on reference signal $V_{REF}$.

According to the present invention, reference cell 150 is a cell of the same size as cells 10 of the array. Hence, reference cell 150 can provide a current which depends on temperature and voltage supply Vdd in the same manner as cell 10A to be read. Furthermore, reference cell 150 is kept in an erased state, either because the cell is never programmed or because, upon initializing the chip, reference cell 150 was programmed and then erased once. Accordingly, the voltage profile of reference cell 150 is similar to the voltage profile provided by any other erased cell in the array.

However, the signal $V_{REF}$ is also affected by bit line emulator 142 which is connected to a drain 162 of reference cell 150. As mentioned hereinabove, bit line emulator 142 includes a plurality of bit lines BLR which have a capacitance $C_{BL}$ associated therewith. The number of bit lines BLR used defines the ratio of the capacitance of bit line emulator 142 to the capacitance felt by cell 10A.

Capacitance $C_{BL}$ reduces the speed at which signal $V_{REF}$ rises and is chosen to ensure that the voltage profile of signal $V_{REF}$ falls between (i.e. is not identical to) the expected programmed and erased voltage profiles of cell 10A to be sensed, as can be seen in FIG. 2D.

FIG. 2D also shows the effect of varying the capacitance $C_{BL}$ of bit line emulator 142. $V_{REF\ (TWO\ BIT-LINES)}$ denotes a voltage profile which is achieved using only two bit lines BLR while $V_{REF\ (THREE\ BIT-LINES)}$ denotes a voltage profile which is achieved using three bit lines BLR. It can be seen that the capacitance provided by each additional bit-line BLR reduces the slope of the voltage profile of $V_{REF}$ from that of the erased profile ($V_{CELL-ERASED}$) toward that of the programmed profile ($V_{CELL-PROGRAMMED}$)

It will be appreciated that the reference signal $V_{REF}$ depends on the responses of reference cell 150 and bit line emulator 142 to the presence of voltage supply $V_{BL}$. Since both reference cell 150 and bit line emulator 142 have the same responses as their complements, cells 10 and bit lines BL of the array, respectively, and since switching transistors 18 and 155 become inactive at the same time, the reference and data signals $V_{REF}$ and $V_{CELL}$, respectively, respond to changes in their environment, particularly those of temperature and power supply level Vdd, in the same way. Thus, the voltage profile of reference signal $V_{REF}$ generally remains between the possible voltage profiles of data signal $V_{CELL}$ even though the environmental conditions may have changed. As a result, their difference, produced by amplifying comparator 102, does not change when the environment changes. Because of this, amplifying comparator 102 can determine the state of cell 10A to be read despite environmental changes and despite the low voltage levels.

Figure 4:
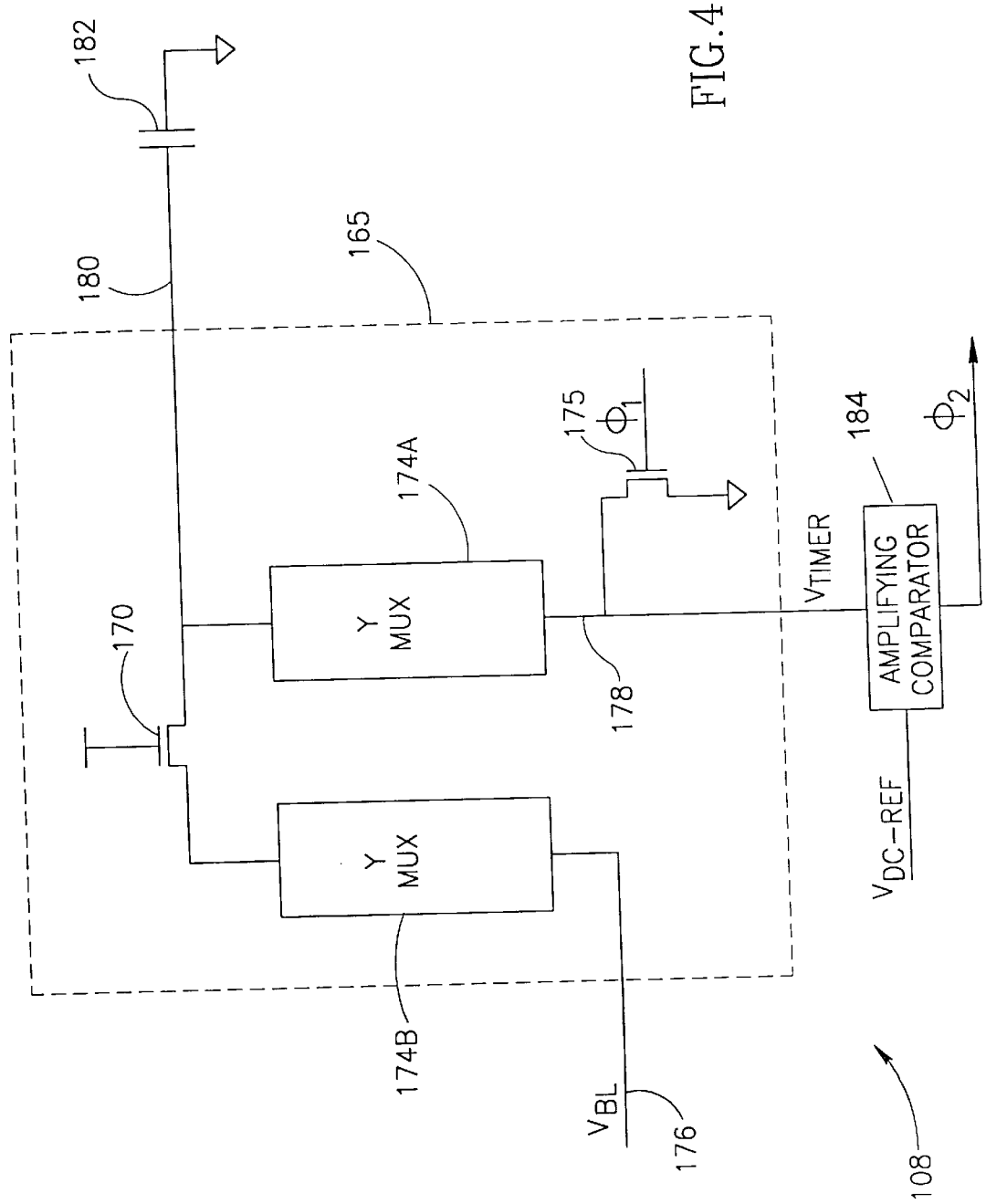
FIG. 4 is a schematic illustration of a timing unit of FIG. 1, constructed and operative in accordance with a preferred embodiment of the present invention.

Reference is now made to FIG. 4, which is a schematic illustration of timing unit 108, constructed and operated in accordance with a preferred embodiment of the present invention.

Timing unit 108 includes a sensing emulator 165, a capacitor 182 and an amplifying comparator 184.

Sensing emulator 165 is similar to sensing emulator 140 and includes a timing cell 170, multiplexors 174A and 174B, a supply line 176, an output line 178 and an NMOS switching transistor 175. Since sensing emulator 165 operates similarly to sensing emulator 140, it will not be described in detail except to indicate that its output signal is $V_{TIMER}$ which, as shown in FIG. 2B, begins rising from ground only once signal $\Phi_1$ inactivates switching transistor 175. Otherwise, timing cell 170 is kept grounded.

Similarly to reference cell 150, timing cell 170 is of the same size as the cells 10 of array 8 and is in the erased state. The capacitance $C_T$ in timing unit 108 is provided by capacitor 182 which is connected between a drain end 180 of timing cell 170 and the ground. Thus, the rate at which $V_{TIMER}$ rises from ground level is determined by the conditions affecting timing cell 170 and the fixed capacitance $C_T$ of capacitor 182. Typically, capacitance $C_T$ is chosen to define the sensing period which occurs from times T1 to T2 (FIG. 2C).

Amplifying comparator 184 (FIG. 4) is connected to output line 178, via switching transistor 175. Comparator 184 is further connected to a voltage source (not shown), which provides a direct current (DC) reference voltage level $V_{DC-REF}$. Typically, reference voltage level $V_{DC-REF}$ is set to a low voltage level, such as 100–150 mV, within the linear operating range of timing cell 170.

Comparator 184 compares between the voltage $V_{TIMER}$, which is detected over the output line 178, and reference voltage $V_{DC-REF}$. Comparator 184 changes the state of its output $\Phi_2$ when the voltage $V_{TIMER}$ rises above reference voltage $V_{DC-REF}$.

Since the timing signal $V_{TIMER}$ starts developing at the same time as the other signals $V_{REF}$ and $V_{CELL}$, and since timing cell 170 depends on environmental conditions in the same way as reference cell 150 and cell 10A, timing unit 108 ensures that timing signal $V_{TIMER}$ reaches DC reference voltage $V_{DC-REF}$ at generally the same point in the development of the other signals $V_{REF}$ and $V_{CELL}$, irrespective of environmental conditions.

Figure 5:
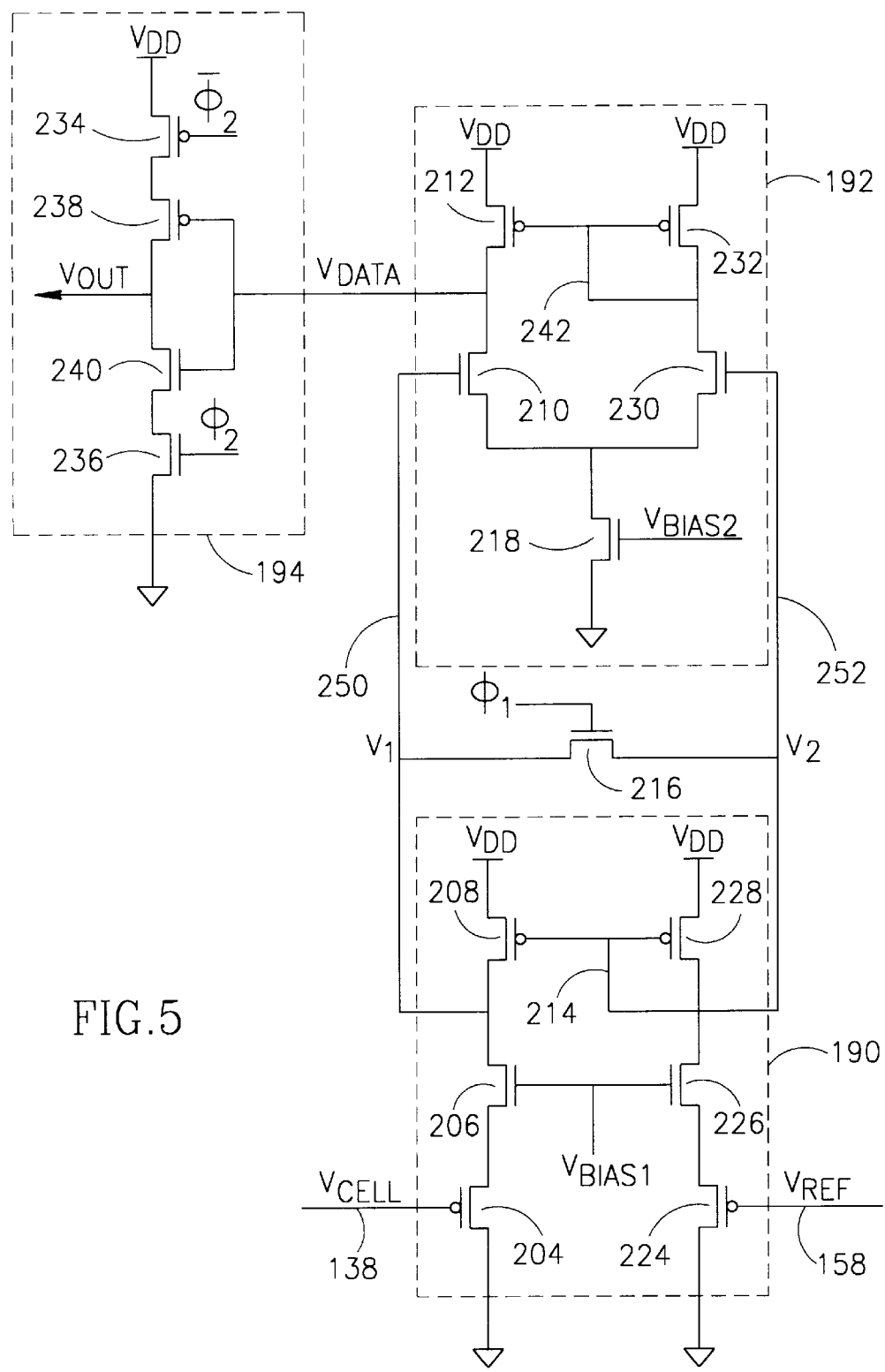
FIG. 5 is an illustration of an amplifying comparator of FIG. 1, constructed and operative in accordance with a preferred embodiment of the present invention.

Reference is now made to FIG. 5, which is a circuit drawing of an amplifying comparator, constructed and operative in accordance with a preferred embodiment of the present invention. The circuit of FIG. 5 is typically utilized for both amplifying comparators 102 and 184. For circuit 102 the two input signals are $V_{CELL}$ and $V_{REF}$, while for circuit 184 the two input signals are $V_{TIMER}$ and $V_{DC-REF}$. FIG. 5 shows the former case, for simplicity.

The amplifying comparator includes a preamplifier 190 (formed of a double ended differential amplifier), a single ended differential comparator 192 and a final stage 194. Preamplifier 190 amplifies the low voltage signals $V_{CELL}$ and $V_{REF}$ and produces therefrom two signals $V_1$ and $V_2$, respectively. Differential comparator 192 produces an amplified difference signal $V_{DATA}$ indicative of the difference between amplified signals $V_1$ and $V_2$, and final stage 194 converts the difference signal to a logical one having either a 0 or a 1 value associated therewith.

It will be appreciated that amplifying comparator 102 provides a high gain signal from the two low voltage signals $V_{CELL}$ and $V_{REF}$, irrespective of temperature or power supply Vdd variations.

Preamplifier 190 includes transistors 204, 206, 208, 224, 226 and 228. The drain of transistors 204 and 224 are connected to the ground. The gate of transistor 204 (a p-channel transistor) is connected to the sensing line 138 which carries $V_{CELL}$ thereon. The gate of transistor 224 (a p-channel transistor) is connected to output line 158 which carries $V_{REF}$ thereon. The source of transistor 204 is connected to the source of transistor 206. The source of transistor 224 is connected to the source of transistor 226.

The gates of transistors 206 and 226 are connected to a voltage source, which applies a voltage level of $V_{BIAS1}$. The drains of transistors 206 and 226 are connected to the drains of transistors 208 and 228, respectively. The source of transistors 208 and 228 are connected to a power supply $V_{DD}$. The gate of transistor 208 is connected to the gate and drain of transistor 228 (see connector 214).

The drains of transistors 208 and 228 are interconnected via a switching transistor 216 (an n-channel transistor), which is activated by control signal $\Phi_1$. Switching transistor 216 equates the outputs $V_1$ and $V_2$ of the pre-amplifier section by short-circuiting lines 250 and 252. When $\Phi_1$ rises (section 302 of FIG. 2A), switching transistor 216 is activated. As $\Phi_1$ descends, switching transistor 216 is deactivated and preamplifier 190 produces output signals $V_1$ and $V_2$. It is noted that $$V_1 = V_2 + K_1 \cdot (V_{CEL} - V_{REF}) \text{ and } V_2 = V_0 + K_2 \cdot V_{REF}$$

where $V_0 = V_1 = V_2$ when $V_{CELL} = V_{REF} = 0$ and $K_1$ denotes the amplification of preamplifier 190 for the differential input signal $V_{CELL} - V_{REF}$ and $K_2$ denotes the amplification of preamplifier 190 for $V_{REF}$.

Comparator 192 includes transistors 210, 212, 218, 230 and 232. Comparator 192 also provides additional amplification of the signals $V_1$ and $V_2$. The source of transistor 218 is connected to the ground. The gate of transistor 218 is connected to a voltage source, which provides a voltage level of $V_{BIAS2}$.

The drain of transistor 218 is connected to the source of transistors 210 and 230. The gate of transistor 210 is connected to the drain of transistor 208. The gate of transistor 230 is connected to the drain of transistor 228. The drain of transistor 210 and 230 are connected to the drains of transistors 212 and 232, respectively. The gate of transistor 212 is connected to the gate and drain of transistor 232 (see connector 242).

The sources of transistors 212 and 232 are connected to a voltage source which provides the supply $V_{DD}$.

At the output of comparator 192, the signal $V_{DATA}$ is determined according to the following:

$$V_{DATA} = V_{DATA-0} + K_3 \cdot (V_2 - V_1) = V_{DATA-0} + K_1 \cdot K_3 \cdot (V_{CELL} - V_{REF})$$

where $V_{DATA-0} = V_{DATA}$, when $V_1 = V_2$ and $K_3$ denotes the amplification of comparator 192.

Final stage amplifier 194 includes switching transistors 234 and 236 and transistors 238 and 240, formed as an inverter. Switching transistor 234 (a p-channel transistor) is connected between the source of transistor 238 and voltage supply $V_{DD}$. It is noted that switching transistors 234 and 236 are not present for amplifying comparator 184 of timing unit 108.

Switching transistor 236 (an n-channel transistor) is connected between the source of transistor 240 and the ground. The gates of transistors 238 and 240 are connected to the output of comparator 192 (i.e. the drain of transistors 210 and 212) thereby receiving signal $V_{DATA}$ which is the pre-amplified result of the comparison between the incoming voltage levels $V_{CELL}$ and $V_{REF}$.

The drain of transistors 238 and 240 forms the output of the entire circuit, providing an amplified output signal indicative of the content of the sensed cell. It is noted that final stage amplifier 194 converts the analog signal $V_{DATA}$ to a digital signal $V_{OUT}$.

Switching transistors 234 and 236 are operated by timing signals $\overline{\Phi_2}$ and $\Phi_2$ (FIG. 2C), respectively. When signal $\overline{\Phi_2}$ is low and $\Phi_2$ is high, switches 234 and 236, respectively, are activated and hence, transistors 238 and 240 are powered so as to produce output signal $V_{OUT}$. When $\overline{\Phi_2}$ is high (i.e., during output period 308) and $\Phi_2$ is low, the switches 234 and 236 are deactivated and hence, there is no output signal at the drain of transistors 238 and 240

It is noted that amplifying comparator 102 provides detection of the content of a cell to be sensed, for very small voltage levels, wherein $$|V_{cell} - V_{ref}| \geq 10 \text{ mV}$$

and where $V_{OUT}$ (of an erased cell) is on the order of $V_{DD}$.

Persons skilled in the art will appreciate that the present invention is not limited to what has been particularly shown and described hereinabove. Rather the scope of the present invention is defined only by the claims which follow.

We claim:

1. A method for sensing a close to ground signal received from an array cell within a memory array, the method comprising the steps of:
    providing a reference unit with a reference cell having a similar structure and a similar current path therethrough to that of said array cell, said reference unit having a reference capacitance which is a multiple of the expected capacitance of a bit line of said array;
    providing a timing unit with a timing cell having a similar structure and a similar current path therethrough to that of said array cell, said timing unit having a predefined timing capacitance;
    discharging said array, said reference unit and said timing unit followed by charging said array, said reference unit and said timing unit, thereby to generate a cell signal, a reference signal and a timing signal, respectively;
    generating a read signal when said timing signal at least reaches a predefined voltage level; and
    generating a sensing signal from the difference of said cell and reference signals once said read signal is generated.

2. A method according to claim 1 and including the step of providing said reference capacitance with a multiplicity of bit lines each having the same structure as said array bit line.

3. A method according to claim 1 and including the step of providing said timing capacitance with a capacitor.

4. A method according to claim 1 and wherein said step of generating a sensing signal includes the steps of amplifying said reference and cell signals, generating a difference signal representing the difference between said amplified reference and cell signals and converting said difference signal to a logical signal.

5. Apparatus for sensing a close to ground, cell signal received from an array cell within a memory array, the apparatus comprising:
    a reference unit having a structure which emulates the response of an erased array cell when charged and a reference capacitance which is a multiple of an expected capacitance of a bit line of said memory array for producing a close to ground reference signal when said array cell is charged;
    a timing unit having a structure which emulates the response of an erased array cell when charged and a predefined timing capacitance for producing a close to ground timing signal when said array cell is charged said timing unit generating a read signal when said timing signal at least reaches a refined voltage level; and
    a differential comparator for generating a sensing signal from the difference of said array cell and reference signals once said read signal is generated.

6. Apparatus according to claim 5 and wherein said reference unit comprises:
    a non-programmed reference cell having a similar structure to that of said array cell;
    a reference multiplexor having a similar current path therethrough to that of said array cell;
    a multiplicity of reference bit lines which provide said reference capacitance, wherein each reference bit line has the same structure as said array bit line; and
    a reference discharge unit for discharging and charging said reference bit lines along with said array cell and for generating said reference signal during charging of said reference unit.

7. Apparatus according to claim 5, wherein said differential comparator comprises:
    a first comparator differential amplifier receiving said cell signal and said reference signal for producing two comparator output signals;
    a second comparator differential amplifier receiving said two comparator output signals for producing a comparator data signal; and
    a driver, receiving said comparator data signal and controlled by said read signal, for providing said sensing signal to an external unit.

8. Apparatus according to claim 5 and wherein said timing unit comprises:
    a non-programmed timing cell having a similar structure to that of said array cell;
    a timing multiplexor having a similar current path therethrough to that of said array cell;

a timing capacitor for providing said timing capacitance;

a timing discharge unit for discharging and charging said timing unit along with said memory array and for generating said timing signal during charging of said timing unit; and a timing comparator for generating said read signal when said timing signal at least reaches said predefined voltage level.

9. Apparatus according to claim 8, wherein said timing comparator comprises:

a first timing differential amplifier receiving said timing signal and a supply signal representing said predefined voltage level for producing two timing output signals;

a second timing differential amplifier receiving said two timing output signals for producing a timing data signal; and a driver receiving said timing data signal for producing said read signal to said differential comparator.

* * * * *